United States Patent [19]

Morikawa et al.

[11] Patent Number: 4,525,434

[45] Date of Patent: Jun. 25, 1985

[54] COPPER ALLOY HAVING HIGH RESISTANCE TO OXIDATION FOR USE IN LEADS ON SEMICONDUCTOR DEVICES AND CLAD MATERIAL CONTAINING SAID ALLOY

[75] Inventors: Masaki Morikawa, Iwatsuki; Hideaki Yoshida, Kasukabe; Kunio Kishida, Ohmiya, all of Japan

[73] Assignees: Mitsubishi Kinzoku Kabushiki Kaisha, Tokyo; Fujitsu Limited, Kawasaki, both of Japan

[21] Appl. No.: 529,593

[22] Filed: Sep. 6, 1983

[30] Foreign Application Priority Data

Oct. 19, 1982 [JP] Japan .................. 57-183554

[51] Int. Cl.³ .................. C23C 5/00
[52] U.S. Cl. .................. 428/674; 428/929
[58] Field of Search .................. 428/929, 675, 674; 420/471, 473, 478–482, 476, 486, 487

[56] References Cited

U.S. PATENT DOCUMENTS 4,366,117  12/1982  Tsuji .................. 420/481

FOREIGN PATENT DOCUMENTS 139173  12/1978  Japan .................. 428/929
134424  10/1979  Japan .................. 420/480
270465   5/1970  U.S.S.R. .................. 420/471

Primary Examiner—Peter K. Skiff
Attorney, Agent, or Firm—Frishauf, Holtz, Goodman & Woodward

[57] ABSTRACT

A Cu alloy having high resistance to oxidation for use in leads on semiconductor devices is disclosed. The alloy consists essentially of 7–15 wt % Mn, 10–30 wt % Zn, 0.2–10 wt % Ni, 0.1–3 wt % Al, with the balance being Cu and incidental impurities. Also disclosed in a Cu alloy clad material wherein the substrate is made of Cu or Cu alloy having high electrical conductivity and good heat dissipation, and the cladding or partial cladding is composed of the Cu alloy having the composition specified above.

2 Claims, No Drawings

COPPER ALLOY HAVING HIGH RESISTANCE TO OXIDATION FOR USE IN LEADS ON SEMICONDUCTOR DEVICES AND CLAD MATERIAL CONTAINING SAID ALLOY

TECHNICAL FIELD

The present invention relates to a Cu alloy having high resistance to oxidation for use in leads on semiconductor devices, and a clad material containing said alloy.

BACKGROUND OF THE INVENTION

Semiconductor devices such as ICs and LSIs are typically fabricated by the following steps:

(a) prepare a lead material from a strip having a thickness of 0.1 to 0.3 mm;

(b) stamp out a lead frame conforming to the shape of the semiconductor device to be fabricated;

(c) apply high-purity Si or Ge semiconductor elements to selected areas of the lead frame by thermocompression with an electrically conductive resin such as Ag paste or by diffusion through a plating of Au, Ag, Ni or their alloys formed on one surface of the lead material and which plating is heated to 350° C. or higher, or by soldering with a binary eutectic alloy such as Au-Si or Au-Ge;

(d) connect the semiconductor elements to the lead frame by gold wires (this is a bonding step);

(e) enclose with a protective plastic or ceramic package the semiconductor elements, gold wires and parts of the lead frame to which the semiconductor elements have been bonded;

(f) remove unnecessary parts from the lead frame to form discrete leads; and (g) apply a soldering material to the legs of the leads to enable connection of the semiconductor device to the substrate.

The material of which the leads on semiconductor devices are made has to meet various requirements: (1) good stampability; (2) heat resistance high enough to avoid deformation and softening due to heat resulting from bonding leads to semiconductor devices; (3) good heat dissipation and electrical conductivity; and (4) strength high enough to avoid breakage due to bending and other mechanical shocks that may be encountered during shipment of the semiconductor devices or their assembling into electrical machines. In terms of characteristic values, the material is required to have a tensile strength of at least 28 kg/mm$^2$, a Vickers hardness of at least 80, an elongation of at least 2%, an electrical conductivity (which is indicative of thermal dissipation or conductivity) of at least 2% IACS, and a softening point (a measure of thermal resistance) of at least 350° C. Conventional materials that satisfy these requirements are Cu alloys such as Fe-doped copper, phosphor bronze and Ag-doped copper.

These materials have high electrical conductivity and hence good heat dissipation, but their resistance to oxidation is so low that leads made of them form an oxide film when they are fusion-bonded to semiconductor devices or when the latter are packed with plastics. This oxide film must be removed before the leads are coated with a soldering material or soldered to the substrate of each semiconductor device. But in order to remove the oxide film, ordinary fluxes which have corrosive effects on the semiconductor device should be replaced by non-corrosive fluxes. However, non-corrosive fluxes are very ineffective and are not capable of completely removing the oxide film. Therefore, almost all semiconductor manufacturers depend on chemical treatments such as cleaning with acids to remove the oxide film. But this method has one fatal defect: it is very difficult to treat only the leg portion of leads with acid solutions and this causes problems in regard to quality control, yield and cost.

SUMMARY OF THE INVENTION

We have made varius studies to find a material that satisfies the requirements met by the conventional materials for leads on semiconductor devices and which also has high resistance to oxidation and will not form an oxide film when leads made of this material are fusion-bonded to the semiconductor device or when the latter is packaged with plastics. As a result, we have found that this object can be accomplished by a copper alloy which contains 7-15 wt% Mn, 10-30 wt% Zn, 0.2-10 wt% Ni and 0.1-3 wt% Al, and optionally, 0.2 to 3 wt% of at least one of Fe, Co and Sn, with the balance being copper and incidental impurities. The alloy satisfies all the requirements met by the conventional materials for leads on semiconductor devices and at the same time, it has so high a resistance to oxidation that it forms a minimal amount of oxide film when leads made of this material are fusion-bonded to the semiconductor device or when the latter is packaged with plastics. Therefore, no chemical treatment such as cleaning with acids is necessary before coating the lead with a solder in the final step of the fabrication of a semiconductor device, and the desired solder coat can be formed by simply using a non-corrosive flux.

We have also found that similar results can be obtained from a clad material in which the substrate is made of pure copper or a copper alloy such as phosphor bronze, Ag-, Cr-, Zr- or Fe-doped copper and the cladding or partial cladding (i.e. covering only the surface area that is to be coated with solder) is made of a copper alloy having the above defined composition. In this clad material, the substrate ensures high electrical conductivity (hence good heat dissipation) and the cladding provides high resistance to oxidation.

DETAILED DESCRIPTION OF THE INVENTION

The present invention has been accomplished on the basis of these findings. The criticality of the composition of the respective components of the copper alloy used independently or as the cladding is hereunder described.

(a) Mn

Manganese increases the strength of the alloy and greatly inhibits the formation of an oxide film in the presence of zinc. if the manganese content is less than 7 wt%, its intended advantages are not obtained. If its content exceeds 15 wt%, difficulties arise in melting a mixture of alloying elements, and the cold workability of the resulting alloy is reduced. Therefore, the manganese content is defined to be in the range of 7 to 15wt%.

(b) Zn

As already mentioned, zinc has the ability to inhibit the formation of an oxide film in the presence of manganese. Furthermore, zinc increases the strength of the alloy and reduces casting defects because of its capability of dehydrogenation during melting. If the zinc content is less than 10wt%, its intended advantages are not obtained. If its content exceeds 30wt%, a great improvement in strength is obtained but on the other hand, the resulting alloy is very low in ductility and is not highly adaptive to working such as rolling. Therefore, the content of zinc is defined to be in the range of 10 to 30 wt%.

(c) Ni

Nickel is an element that provides increased strength and heat resistance. If its content is less than 0.2 wt%, this advantage is not obtained, and if its content exceeds 10 wt%, the resulting alloy is not highly adaptive to working such as rolling. Therefore, the content of nickel is defined to be in the range of 0.2 to 10 wt%.

(d) Al

Aluminum is effective for significant improvement of the strength and heat resistance of alloys. It also works as an effective deoxidizer during melting and helps produce a sound casting. However, if the aluminum content is less than 0.1 wt%, its desired effects are not obtained, and if its content exceeds 3 wt%, the resulting alloy is not highly adaptive to working such as rolling. Therefore, the aluminum content is defined to be in the range of 0.1 to 3 wt%.

(e) Fe, Co and Sn

These elements are effective in achieving a further increase in the alloy strength, and may be incorporated if higher strength is necessary. However, this advantage is not obtained if their content is less than 0.2 wt%. On the other hand, if the content of Fe, Co or Sn exceeds 3 wt%, the resulting alloy is not highly adaptive to processing such as rolling. Therefore, their content is defined to be in the range of 0.2 to 3 wt%.

The copper alloy of the present invention and the clad material using that alloy are hereunder described in greater detail by reference to two working examples.

EXAMPLE 1

Melts having the compositions shown in Table 1 were prepared in a graphite crucible in atmosphere placed in the conventional high-frequency heating furnace. The melts were cast into slabs (40 mm × 200 mm × 3,000 mm) by the conventional continuous casting technique. After grinding the surface, the slabs were hot-rolled into sheets 10 mm thick. The sheets were subjected to repeated cycles of treatment consisting of cold running and bright annealing. The so treated sheets were slit into nineteen semi-hardened samples 10 mm wide and 0.25 mm thick. Sixteen of them were samples of the present invention, and the remainder were samples of the three materials (Fe-doped copper, phosphor bronze and Ag-doped copper) conventionally used in leads on semiconductor devices.

The individual samples were checked for their tensile strength, Vickers hardness, elongation, electrical conductivity coefficient of thermal expansion and softening point. In addition, the samples were held at 250° C. (the temperature at which conventional semiconductors are packaged with plastics) in atmosphere for 10, 20 and 30 minutes and thereafter checked for their wettability with solder using rosin as a non-corrosive flux. The results are shown in Table 1, wherein O refers to good adhesion to solder and X refers to incomplete adhesion.

EXAMPLE 2

Cu and Cu alloy melts for the substrate and cladding having the compositions indicated in Table 2 were prepared in a graphite crucible in atmosphere placed in the conventional high-frequency heating furnace. The melts were cast into slabs (40 mm × 200 mm × 3,000 mm) by the conventional continuous casting technique. After grinding the surface, the slabs were hot-rolled into sheets 10 mm thick. The sheets were subjected to repeated cycles of treatment consisting of cold rolling and bright annealing. By assembling these cold-rolled sheets according to the combinations indicated in Table 2, sixteen semi-hardened samples of clad material measuring 30 mm wide and 0.25 mm thick and having the constructions shown in Table 2 (A: the substrate was sandwiched by a cladding 0.025 mm thick; B: the substrate was clad on one side with a layer 0.03 mm thick; C: a cladding 7.5 mm wide and 0.05 mm thick was formed along two side bands on one surface of the substrate; D: a cladding 7.5 mm wide and 0.05 mm thick was formed along two side bands on both surfaces of the substrate; E: the substrate was clad on one side with a layer 0.05 mm thick; F: the substrate was sandwiched by a cladding 0.05mm thick) were prepared.

The individual clad samples were checked for their tensile strength, elongation and electrical conductivity. In addition, the Vickers hardness of the substrate and cladding of each sample was measured. The results are shown in Table 2. As in Example 1, the clad samples were held at 250° C. in atmosphere for 10, 20 and 30 minutes and thereafter checked for their wettability with solder using rosin as a non-corrosive flux. The results are also shown in Table 2, wherein O refers to complete adhesion to solder and X refers to incomplete adhesion.

For purposes of comparison, the substrates, or the conventional Cu alloy samples, were subjected to the same measurements and the results are shown in Table 2.

TABLE 1

| Cu Alloy samples | Composition (wt %) | | | | | | | | Tensile Strength (kg/mm$^2$) | Elongation (%) | Hardness (Hv) | Electrical conductivity (% IACS) | Coefficient of thermal expansion (10$^{-6}$/°C.) | Softening paint (°C.) | Wettability with solder | | |
|---|---|---|---|---|---|---|---|---|---|---|---|---|---|---|---|---|---|
| | Mn | Zn | Ni | Al | Fe | Co | Sn | Cu | | | | | | | 10-min. heating | 20-min. heating | 30-min. heating |
| Samples of the present invention | | | | | | | | | | | | | | | | | |
| 1 | 7.3 | 29.3 | 3.1 | 0.9 | — | — | — | bal. | 51 | 2.9 | 135 | 2.8 | 17.0 | 625 | O | O | O |
| 2 | 10.2 | 21.0 | 3.0 | 0.8 | — | — | — | bal. | 52 | 3.0 | 135 | 3.0 | 17.0 | 620 | O | O | O |
| 3 | 14.5 | 10.8 | 3.3 | 1.1 | — | — | — | bal. | 50 | 2.5 | 130 | 3.1 | 17.5 | 630 | O | O | O |
| 4 | 10.1 | 24.9 | 0.3 | 1.0 | — | — | — | bal. | 47 | 2.3 | 130 | 2.8 | 17.5 | 620 | O | O | O |
| 5 | 9.8 | 25.3 | 9.8 | 1.1 | — | — | — | bal. | 63 | 2.0 | 155 | 2.7 | 17.0 | 680 | O | O | O |
| 6 | 14.2 | 25.0 | 2.0 | 0.2 | — | — | — | bal. | 55 | 2.1 | 140 | 2.8 | 17.5 | 635 | O | O | O |

TABLE 1-continued

| Cu Alloy samples | Composition (wt %) | | | | | | | | Tensile Strength (kg/mm²) | Elongation (%) | Hardness (Hv) | Electrical conductivity (% IACS) | Coefficient of thermal expansion (10⁻⁶/°C.) | Softening paint (°C.) | Wettability with solder | | |
|---|---|---|---|---|---|---|---|---|---|---|---|---|---|---|---|---|---|
| | Mn | Zn | Ni | Al | Fe | Co | Sn | Cu | | | | | | | 10-min. heating | 20-min. heating | 30-min. heating |
| 7 | 10.4 | 25.0 | 3.0 | 2.8 | — | — | — | bal. | 58 | 2.1 | 145 | 2.6 | 17.0 | 660 | O | O | O |
| 8 | 10.1 | 25.2 | 5.3 | 0.8 | 0.3 | — | — | bal. | 56 | 2.3 | 142 | 2.7 | 17.1 | 663 | O | O | O |
| 9 | 9.8 | 24.7 | 5.0 | 0.9 | 1.0 | 0.4 | — | bal. | 58 | 2.2 | 145 | 2.5 | 17.1 | 680 | O | O | O |
| 10 | 10.3 | 24.9 | 4.3 | 0.7 | 2.5 | — | 0.2 | bal. | 59 | 2.0 | 149 | 2.7 | 17.0 | 673 | O | O | O |
| 11 | 10.2 | 25.1 | 4.1 | 0.7 | 0.5 | 1.1 | 0.9 | bal. | 63 | 2.1 | 155 | 2.8 | 17.3 | 682 | O | O | O |
| 12 | 9.7 | 24.8 | 4.5 | 0.8 | — | 2.8 | — | bal. | 62 | 2.2 | 153 | 2.7 | 17.2 | 680 | O | O | O |
| 13 | 10.0 | 25.0 | 4.4 | 0.8 | — | 0.6 | 2.0 | bal. | 64 | 2.1 | 155 | 2.9 | 17.3 | 670 | O | O | O |
| 14 | 13.8 | 18.2 | 3.1 | 1.1 | — | — | — | bal. | 59 | 2.3 | 149 | 2.9 | 17.1 | 673 | O | O | O |
| 15 | 10.0 | 11.0 | 4.0 | 0.3 | 1.0 | — | — | bal. | 55 | 2.5 | 140 | 3.0 | 17.5 | 660 | O | O | O |
| 16 | 10.1 | 25.5 | 3.0 | 0.7 | — | — | 1.0 | bal. | 55 | 2.6 | 141 | 2.9 | 17.8 | 660 | O | O | O |
| Conventional samples | | | | | | | | | | | | | | | | | |
| 1 | Cu - 0.1% Zn - 2.4% Fe - 0.03% P | | | | | | | | 41 | 2.9 | 120 | 65.0 | 16.3 | 550 | X | — | — |
| 2 | Cu - 6% Sn - 0.2% P | | | | | | | | 65 | 3.5 | 150 | 17.0 | 16.5 | 350 | X | — | — |
| 3 | Cu - 0.1% Ag | | | | | | | | 28 | 3.0 | 82 | 98.0 | 17.7 | 350 | X | — | — |

TABLE 2

| Cu clad samples | Substrate composition (wt %) | Cladding composition (wt %) | | | | | | | | Construction | Tensile strength (kg/mm²) | Elongation (%) | Hardness (Hv) | | Electrical conductivity (% IACS) | Wettability with solder | | |
|---|---|---|---|---|---|---|---|---|---|---|---|---|---|---|---|---|---|---|
| | | Mn | Zn | Ni | Al | Fe | Co | Sn | Cu | | | | Substrate | Cladding | | 10-min. heating | 20-min. heating | 30-min. heating |
| Samples of the present invention | | | | | | | | | | | | | | | | | | | |
| 1 | Zn: 0.1, Fe: 2.4, P: 0.03, Cu: bal. (Fe-doped) | 7.4 | 29.6 | 3.0 | 0.9 | — | — | — | bal. | A | 43 | 2.8 | 121 | 133 | 52.5 | O | O | O |
| 2 | | 10.1 | 21.2 | 3.1 | 0.8 | — | — | — | bal. | A | 43 | 2.9 | 122 | 134 | 52.6 | O | O | O |
| 3 | | 14.5 | 10.9 | 3.2 | 1.1 | — | — | — | bal. | A | 42 | 2.6 | 119 | 131 | 52.6 | O | O | O |
| 4 | Sn: 6, P: 0.2, Cu: bal. (phosphor bronze) | 10.0 | 25.1 | 0.3 | 1.0 | — | — | — | bal. | B | 63 | 3.3 | 150 | 133 | 15.3 | O | O | O |
| 5 | | 9.8 | 25.7 | 10.1 | 1.2 | — | — | — | bal. | B | 64 | 3.0 | 151 | 155 | 15.2 | O | O | O |
| 6 | | 14.4 | 24.8 | 2.0 | 0.2 | — | — | — | bal. | B | 63 | 3.1 | 150 | 143 | 15.3 | O | O | O |
| 7 | Ag: 0.1, Cu: bal. (Ag-doped) | 10.3 | 25.0 | 3.0 | 2.8 | — | — | — | bal. | C | 31 | 2.6 | 83 | 141 | 88.5 | O | O | O |
| 8 | | 10.2 | 25.1 | 5.3 | 0.8 | 0.3 | — | — | bal. | C | 30 | 2.8 | 84 | 140 | 88.5 | O | O | O |
| 9 | | 9.8 | 25.0 | 5.1 | 0.9 | 0.8 | 0.5 | — | bal. | C | 31 | 2.8 | 83 | 142 | 88.4 | O | O | O |
| 10 | Cr: 0.8, Cu: bal. (Cr-doped) | 10.6 | 24.8 | 4.3 | 0.7 | 2.4 | — | 0.3 | bal. | D | 50 | 2.2 | 135 | 148 | 68.5 | O | O | O |
| 11 | | 10.0 | 25.2 | 4.0 | 0.7 | 0.5 | 1.1 | 0.8 | bal. | D | 51 | 2.1 | 132 | 154 | 68.6 | O | O | O |
| 12 | Zr: 0.5, Cu: bal. (Zr-doped) | 9.8 | 24.6 | 4.4 | 0.8 | — | 2.8 | — | bal. | E | 48 | 2.2 | 105 | 153 | 69.3 | O | O | O |
| 13 | | 10.1 | 24.9 | 4.5 | 0.7 | — | 0.6 | 2.1 | bal. | E | 49 | 2.2 | 107 | 154 | 69.5 | O | O | O |
| 14 | Oxygen free Cu (pure Cu) | 13.9 | 18.0 | 3.2 | 1.0 | 1.2 | — | — | bal. | F | 40 | 3.6 | 81 | 148 | 61.2 | O | O | O |
| 15 | | 9.9 | 11.2 | 3.9 | 0.3 | 1.1 | — | — | bal. | F | 38 | 3.5 | 81 | 140 | 61.3 | O | O | O |
| 16 | | 9.7 | 24.8 | 3.1 | 0.7 | — | — | 0.9 | bal. | F | 38 | 3.5 | 80 | 142 | 61.2 | O | O | O |
| Conventional Samples | | | | | | | | | | | | | | | | | | | |
| 1 | Zn: 0.1, Fe: 2.4, P: 0.03, Cu: bal. (Fe- | | | | | — | | | | | 39.1 | 3.1 | 118 | — | 65.0 | X | X | X |

TABLE 2-continued

| Cu clad samples | Substrate composition (wt %) | Cladding composition (wt %) | | | | | | | | Construction | Tensile strength (kg/mm²) | Elongation (%) | Hardness (Hv) | | Electrical conductivity (% IACS) | Wettability with solder | | |
|---|---|---|---|---|---|---|---|---|---|---|---|---|---|---|---|---|---|---|
| | | Mn | Zn | Ni | Al | Fe | Co | Sn | Cu | | | | Substrate | Cladding | | 10-min. heating | 20-min. heating | 30-min. heating |
| 2 | doped) Sn: 6, P: 0.2, Cu: bal. (phosphor bronze) | | | | — | | | | | | 44.6 | 2.8 | 149 | — | 15.1 | X | X | X |
| 3 | Ag: 0.1, Cu: bal. (Ag-doped) | | | | — | | | | | | 26.9 | 3.6 | 83 | — | 98.0 | X | X | X |
| 4 | Cr: 0.8, Cu: bal. (Cr-doped) | | | | — | | | | | | 50.1 | 2.9 | 135 | — | 86.2 | X | X | X |

Table 1 shows that the copper alloy samples Nos. 1 to 16 of the present invention have good properties of strength, electrical conductivity and heat resistance. Furthermore, they exhibited good wettability to solder even after they were exposed to 250° C. in atmosphere for 30 minutes. However, the three conventional samples did not have high resistance to oxidation, so when they were held at 250° C. in atmosphere for 10 minutes, a thick oxide film formed and reduced their wettability with solder.

Table 2 shows that the Cu alloy clad samples 1 to 16 of the present invention had a tensile strength of 28 kg/mm² or more, a Vickers hardness of 80 or more, an elongation of 2% or more, and an electrical conductivity of 2% IACS or more. In addition, they were highly resistant to oxidation and exhibited good wettability with solder. On the other hand, the conventional Cu alloy samples 1 to 4 were low in resistance to oxidation and had a very poor wettability with solder.

Because of these advantages, the Cu alloy of the present invention can be effectively used as the material for leads on semiconductors, and the leg portion of the lead made of this alloy can be coated with solder or can be soldered to the substrate of a semiconductor by simply using a non-corrosive flux without the need for a cumbersome chemical treatment. The same results are obtained with a clad material which has an oxidation-resistant cladding in at least the area to be soldered.

What is claimed is:

1. A Cu alloy clad material for use in leads on semiconductor devices comprising a substrate wholly or partially covered by a clad metal, wherein the substrate is a Cu or Cu alloy having high electrical conductivity and good heat dissipation, and the clad metal is a Cu alloy having high resistance to oxidation which consists essentially of 7-15% Mn, 10-30% Zn, 0.2-10% Ni, 0.1-3% Al, the percentage being by weight, with the balance being Cu and incidental impurities.

2. A Cu alloy clad material for use in leads on semiconductor devices comprising a substrate wholly or partially covered by a clad metal, wherein the substrate is a Cu or Cu alloy having high electrical conductivity and good heat dissipation, and the clad metal is a Cu alloy having high resistance to oxidation which consists essentially of 7-15% Mn, 10-30% Zn, 0.2-10% Ni, 0.1-3% Al and 0.2-3% of at least one of Fe, Co and Sn, the percentage being by weight, with the balance being Cu and incidental impurities.

* * * * *